United States Patent
Shimizu et al.

(10) Patent No.: US 7,199,441 B2
(45) Date of Patent: Apr. 3, 2007

(54) OPTICAL MODULE DEVICE DRIVEN BY A SINGLE POWER SUPPLY

(75) Inventors: Junichiro Shimizu, Hino (JP); Shigeki Makino, Kokubunji (JP); Masahiro Aoki, Kokubunji (JP)

(73) Assignees: Hitachi, Ltd., Tokyo (JP); Opnext Japan, Inc., Kanagawa (JP)

( * ) Notice: Subject to any disclaimer, the term of this patent is extended or adjusted under 35 U.S.C. 154(b) by 306 days.

(21) Appl. No.: 10/915,534

(22) Filed: Aug. 11, 2004

(65) Prior Publication Data

US 2005/0275053 A1 Dec. 15, 2005

(30) Foreign Application Priority Data

Jun. 11, 2004 (JP) ............................. 2004-174368

(51) Int. Cl.
*H01L 27/14* (2006.01)
(52) U.S. Cl. ...................... 257/446; 257/523; 257/414; 257/428; 257/431; 257/443; 257/499; 257/506
(58) Field of Classification Search ................... 257/93, 257/446, 499, 523
See application file for complete search history.

(56) References Cited

U.S. PATENT DOCUMENTS 6,859,479 B2 * 2/2005 Svenson

FOREIGN PATENT DOCUMENTS

| JP | 9-51142 | 8/1995 |
|---|---|---|
| JP | 2000-232252 | 2/1999 |

* cited by examiner

Primary Examiner—Nathan J. Flynn
Assistant Examiner—Kevin Quinto
(74) *Attorney, Agent, or Firm*—Reed Smith LLP; Stanley P. Fisher, Esq.; Juan Carlos A. Marquez, Esq.

(57) ABSTRACT

An optical integrated circuit having optical devices is fabricated. These optical devices must be biased in the mutually opposite directions. If such an optical integrated circuit is fabricated using a conductive semiconductor substrate as conventionally, it is not possible to drive the devices by a single power supply since the substrate side is shared as a common polarity by the devices. The present invention realizes a structure where both anode and cathode of each device can be isolated electrically by conventional process technology and provides an optical integrated circuit which can be driven by a single power supply.

An optical integrated circuit is formed on a semi-insulative or insulative substrate. A high resistivity region which extends at least from the active layer to the substrate and includes part of an optical waveguide between the devices is formed so as to electrically isolate the anode and cathode of each integrated device from the other device.

15 Claims, 12 Drawing Sheets

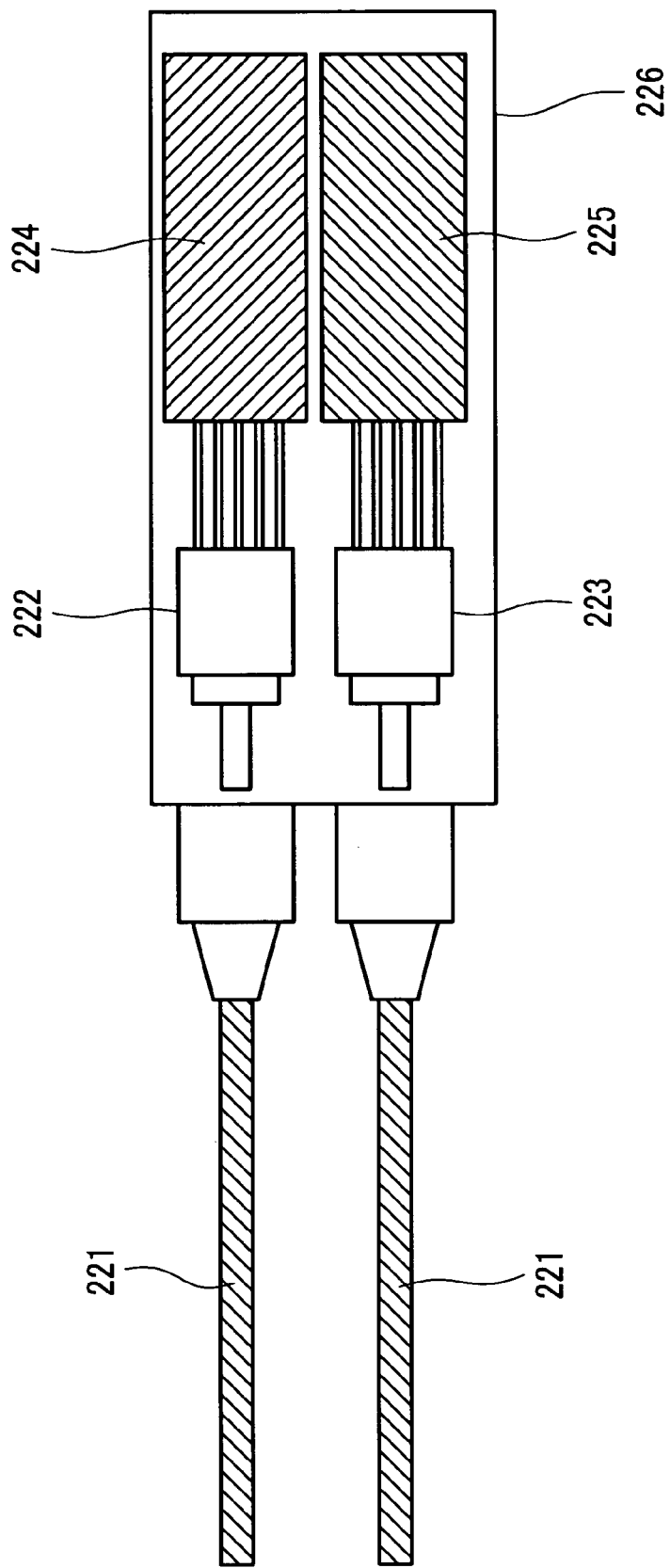

OPTICAL MODULE DEVICE DRIVEN BY A SINGLE POWER SUPPLY

CLAIM OF PRIORITY

The present application claims priority from Japanese application JP 2004-174368, filed on Jun. 11, 2004, the content of which is hereby incorporated by reference into this application.

BACKGROUND OF THE INVENTION

1. Field of the Invention

The present invention relates to optical waveguide devices. In particular, the invention relates to a device where active elements, such as a semiconductor laser and semiconductor optical modulator, are monolithically integrated, an optical transmission module using such devices and an optical communication system unit using such modules.

2. Description of the Related Art

Optical waveguide devices, such as semiconductor lasers, optical modulators, optical amplifiers and optical detectors, are key devices used for optical communication, optical data storage, measurement and the like. With the recent advance of optical components in miniaturization, monolithic integration of such individual devices is becoming more popular. One typical example is an optical communication chip where a semiconductor laser and an optical modulator are monolithically integrated.

In a typical light emitting or amplifying waveguide device such as a semiconductor laser or optical amplifier, its active region has a hetero junction consisting of a p-type semiconductor and a n-type semiconductor. To this p-n junction, a voltage is applied so that the p-type semiconductor side has a higher potential while the n-type semiconductor side has a lower potential. This injects carriers into the junction constituting the active region, resulting in light emission and amplification. In the case of such a device as a semiconductor optical modulator or optical detector, although it has a similar p-n junction, this p-n junction is biased to absorb light in such a manner that the n-type semiconductor has a higher potential while the p-type semiconductor has a lower potential. Hereinafter, biasing from the p-type semiconductor to the n-type semiconductor is called forward bias whereas biasing from the n-type semiconductor to the p-type semiconductor is called reverse bias.

A semiconductor optical module device is a device where two or more abovementioned optical waveguide devices are integrated. Therefore, it is sometimes necessary to integrate devices which must be biased in the mutually opposite directions. As described earlier, typically, a semiconductor optical waveguide device has a p-n junction. By using the MBE method, MOCVD method or the like, this p-n junction is formed by epitaxially growing an n-type semiconductor and p-type semiconductor on a semiconductor substrate. In the case of a GaAs or InP substrate, the substrate has a thickness of about 100 μm or more. By contrast, epitaxially grown semiconductor layers are at most of an order of 10 μm in thickness. Accordingly, even if devices which are biased in the mutually opposite directions are integrated in a chip, the substrate side of either device is usually set to the same potential when the chip is used. This is because the substrate side of one device is electrically connected with that of the other device since the substrate side of either device is of the same conductivity type and grown epitaxially on the same substrate.

One example is an EA/DFB chip used as a light source for optical fiber communication. It contains a distributed feedback (DFB) laser and an electroabsorption (EA) modulator. When the DFB laser is forward biased, the DFB laser lases to continuously emit light which enters the EA modulator via an optical waveguide formed in the chip. The EA modulator is made of a semiconductor whose bandgap wavelength is shorter than the wavelength of the incident light from the laser. When no voltage is applied to between the anode and cathode of the EA modulator, the EA modulator is transparent for the laser light. Propagating through the waveguide of the EA modulator, the laser light incident on the modulator is emitted from the front of the chip. If the EA modulator is reversely biased, the bandgap wavelength becomes longer due to the quantum confined Stark effect. The EA modulator becomes not transparent for the incident laser light. Since the light is absorbed by the EA modulator, no light is emitted from the front. To perform modulation, the EA modulator repeatedly switches on and off the laser light at high speed by alternately serving as an optical transmitter and an optical absorber.

Today, the EA/DB laser is fabricated as below. Typically, an EA modulator and a DFB laser, both multi-layered, are epitaxially grown on an n-InP substrate which is an n-type doped semiconductor. The EA modulator and the DFB laser may be grown either concurrently or separately. After the epitaxial growth, the top p-type semiconductor is shaped by photolithography technology and etching into a stripe of several μm in width to form an optical waveguide. Usually, the same tripe is used by both DFB laser and EA modulator so that they will optically be coupled to each other. As the case may be, not only the p-type semiconductor layer on the top of the stack structure but also the n-type semiconductor below the p-n junction are etched into a stripe. In the case of a buried type chip, the semiconductor-removed etched regions are filled again with a semi-insulative semiconductor.

The following describes how the EA/DFB is driven. In order to operate the two integrated devices independent of each other, it is necessary at least to electrically separate the p or n side electrode of one device from that of the other device. Usually, an isolation region is formed between two devices. Since the upper cladding layer is shaped into a several μm width stripe, the isolation region can be made enough long relative to the small section area to impose a large separating resistance between the two devices. In the case of the aforementioned EA/DFB, the top anode side, that is, the p side is separated with a separating resistance in the range of several ten kilo-ohms to several mega-ohms.

If the isolation region cannot be made enough long, low resistance layers such as the electrode contact layer in this region are removed by etching. Alternatively, ions are implanted into this area to enlarge the resistance.

Whereas the p side electrode (anode) of one device is electrically separated from that of the other device as described above, the n side electrode (cathode) of either device is formed on the same substrate used as a common ground with no electrical separation between the integrated devices.

This EA/DFB chip of the conventional structure has the common ground. To drive the integrated devices independently of each other by biasing them in the mutually opposite directions, it is therefore necessary for each device to have a separate drive power supply. In the EA/DFB, the DFB laser is driven by a positive power supply whereas the EA is driven by a negative power supply.

FIG. 1 is a simplified circuit diagram for showing how the conventional EA/DFB is driven. The DFB laser is driven by applying a positive voltage to the anode and grounding the cathode. This causes an electric field from the higher potential anode to the lower potential cathode, which implants carriers into the active layer. Meanwhile, the electroabsorption optical modulator is driven by applying a negative voltage to the anode and grounding the cathode shared by the DFB laser. This causes an electric field from the higher potential cathode to the lower potential anode, which changes the bandgap to absorb light. That is, the DFB laser is driven by a positive power supply whereas the EA modulator is driven by a negative power supply.

FIG. 3 shows a conventional ridge waveguide EA/DFB chip. FIG. 4 shows a cross-sectional view of the active layer of FIG. 3 taken along the direction of the waveguide. FIG. 5 shows a cross-sectional view of the EA modulator taken along the direction perpendicular to the waveguide. The DFB laser and the EA modulator are integrated on a n-type InP substrate 101. Although the DFB laser and the EA modulator are electrically separated in the isolation region, they are optically coupled by the optical waveguide there. This isolating region is made enough long in the waveguide direction. Alternatively, either the highly doped top layer formed to provide ohmic contact with the electrode metal is trimmed by etching or ions are implanted 112 so as to sufficiently raise the isolation resistance. This resistance suppresses electrical crosstalk between the devices, allowing stable operation. Also note that the n-side electrode 113 is formed as a common electrode below the n-type InP substrate 101. This n side electrode is to be grounded.

In this conventionally structured EA/DFB, since a common ground is shared by the respective integrated devices, the p electrode 109 of one device must be set to a positive potential so as to forward bias the device whereas the p electrode 107 of the other device must be set to a negative potential so as to reversely bias the device. That is, such an integrated device structure requires one positive power supply and one negative power supply at least. The same holds for integration on a p-type substrate. In this case, an anode p electrode 113 is formed below the substrate and used as a common ground.

Although a device to be biased forward and a device to be biased reversely are integrated in such a chip as an EA/DFB, it is rational to drive them by a single power supply since the configuration can be miniaturized and simplified due to the elements decreased.

To give a positive bias to one device and a negative bias to the other device by a signal positive or negative power supply, such a circuit as shown in FIG. 2 must be configured. In this configuration, if the two devices are monolithically integrated, both anode and cathode of one device must be electrically separated from those of the other device whereas in the conventional configuration, only anode or cathode of one device must be electrically separated from that of the other device.

If an electrode is formed as a common ground at the bottom of a substrate as in a conventional EA/DFB, it is structurally difficult to electrically separate the ground side. To realize separate ground side electrodes in a semiconductor optical waveguide chip, structural invention is necessary.

Among the prior inventions concerning integrated device structures to be driven by signal power supplies, there are Japanese Patent Laid-open No. 9-51142 and Japanese Patent Laid-open No. 2000-232252. Japanese Patent Laid-open No. 9-51142 discloses a structure characterized in that the p type and n type semiconductor layers of one device are epitaxially grown in this order on a conductive substrate whereas the n type and p type semiconductor layers of the other device are grown likewise in this opposite. These devices are driven by giving the same bias from the top to bottom by using a single power supply. In this structure, the device properties may deteriorate since many p-n junctions are formed. In addition, this structure is not feasible since it is difficult to epitaxially grow such layers. Japanese Patent Laid-open No. 2000-232252 discloses a structure characterized in that a layer which exists between the substrate and an active layer of a device is oxidized to electrically separate the device from the substrate. Since the layer to be oxidized in this structure must contain aluminum, its applicability depends on the material. In addition, this structure has a drawback in which the coupling efficiency between the devices is low since the devices are not coupled by the waveguide.

SUMMARY OF THE INVENTION

It is an object of the present invention to realize electric isolation of the anode and cathode of each device from the other device. Unlike the method disclosed in Japanese Patent Laid-open No. 9-51142, this method can be implemented by available process technology and is not dependent on the material and does not lower the coupling frequency. This method provides an optical integrated circuit which can be driven by a single power supply.

The above-mentioned object can be attained by an optical integrated circuit which is driven by a single power supply. The optical integrated circuit includes at least two devices which are biased in the mutually opposite directions. Each of the devices includes: an electrically semi-insulative or insulative substrate or an electrically semi-insulative or insulative first layer; a second layer containing an active layer formed on the substrate or the first layer; an optical waveguide which is formed on the second layer so as to optically couple with the other device; and a selectively formed high-resistivity isolation region which partly includes the optical waveguide and the active layer and extends to at least the substrate or the first layer so that each of the anode and cathode of the device is electrically isolated from the other device.

According to the present invention, the anode and cathode of each integrated optical waveguide device can be isolated electrically from the other device. Thus, since it is not necessary for the devices to share the same electrode set to a common potential, power supply lines can freely be connected to each device. That is, forward biasing of one device and reverse biasing of another device can be realized since either electrode of each device can be given a higher or lower potential. Accordingly, a plurality of integrated devices can be driven by a single positive or negative power supply. If the drive voltage of any device is lower than a specific level, setting the power supply voltage to the specific level allows a single positive or negative power supply to drive all monolithically integrated devices by supply power to them.

BRIEF DESCRIPTION OF THE DRAWINGS

FIG. 12 schematically illustrates a compact optical transceiver package in which a compact optical transmission module according to a third embodiment and a separate compact module are mounted.

DESCRIPTION OF THE PREFERRED EMBODIMENTS

The present invention realizes electrical isolation of both anode and cathode of each integrated device from the other integrated device and provides an optical integrated waveguide device chip which can be driven by a single power supply. To allow an optical integrated waveguide device chip to be driven by a single positive or negative power supply, both anode and cathode of each integrated device must electrically be isolated as described earlier.

FIRST EMBODIMENT

Figure 1:
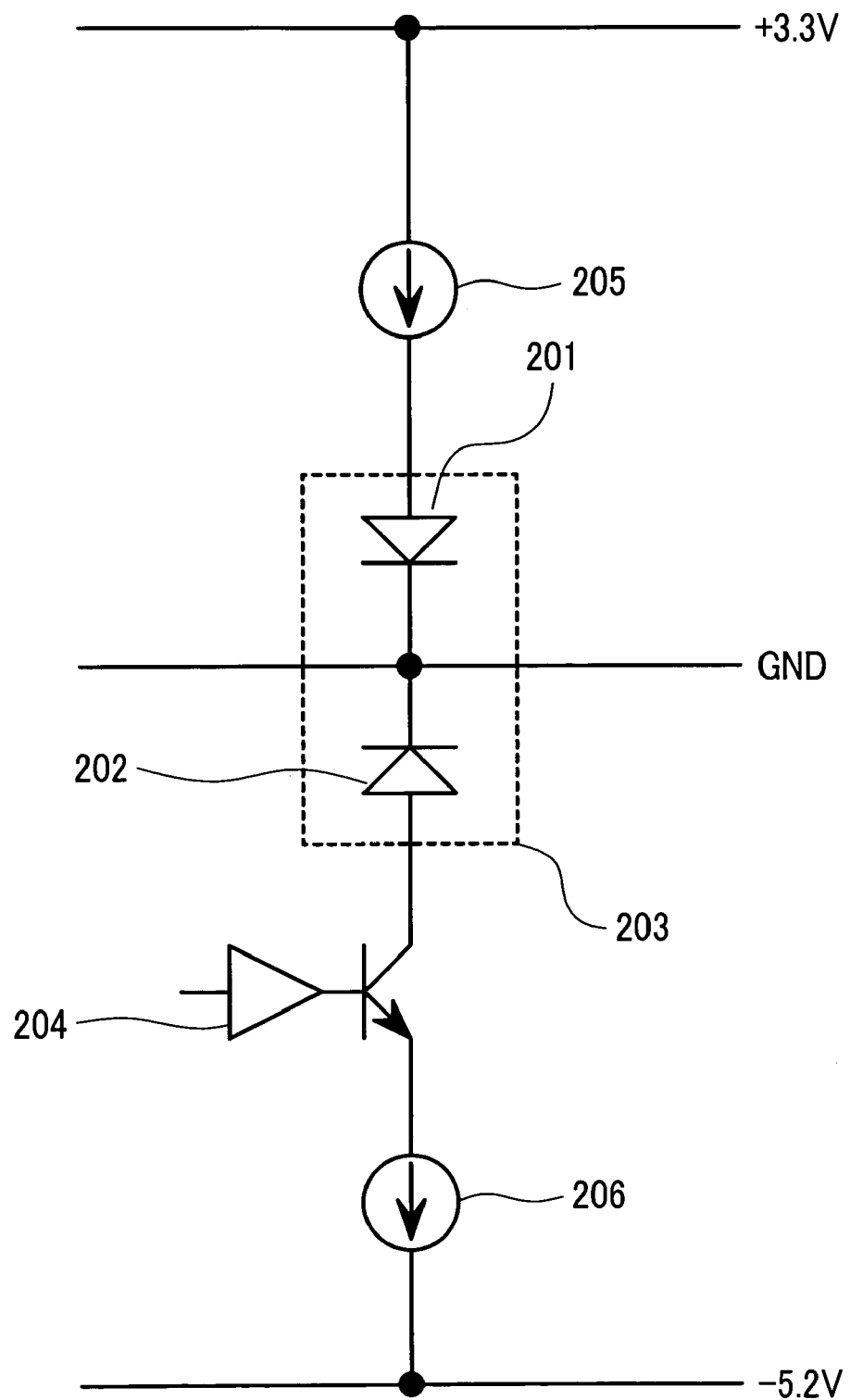
FIG. 1 is a simplified circuit diagram illustrating how a conventional EA/DFB is driven.
Figure 2:
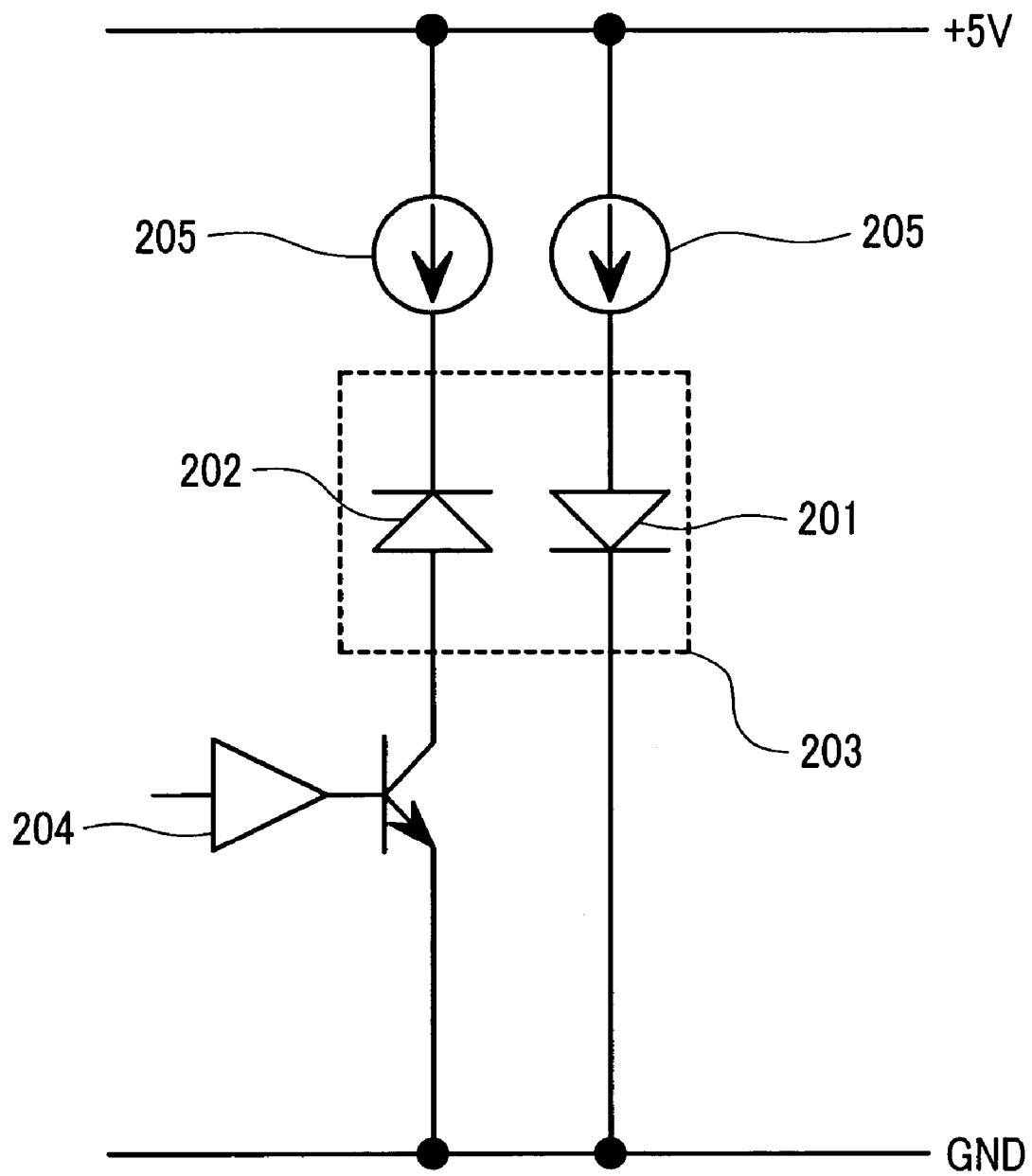
FIG. 2 is a simplified circuit diagram illustrating how an EA/DFB is driven by a single power supply according to the present invention.
Figure 3:
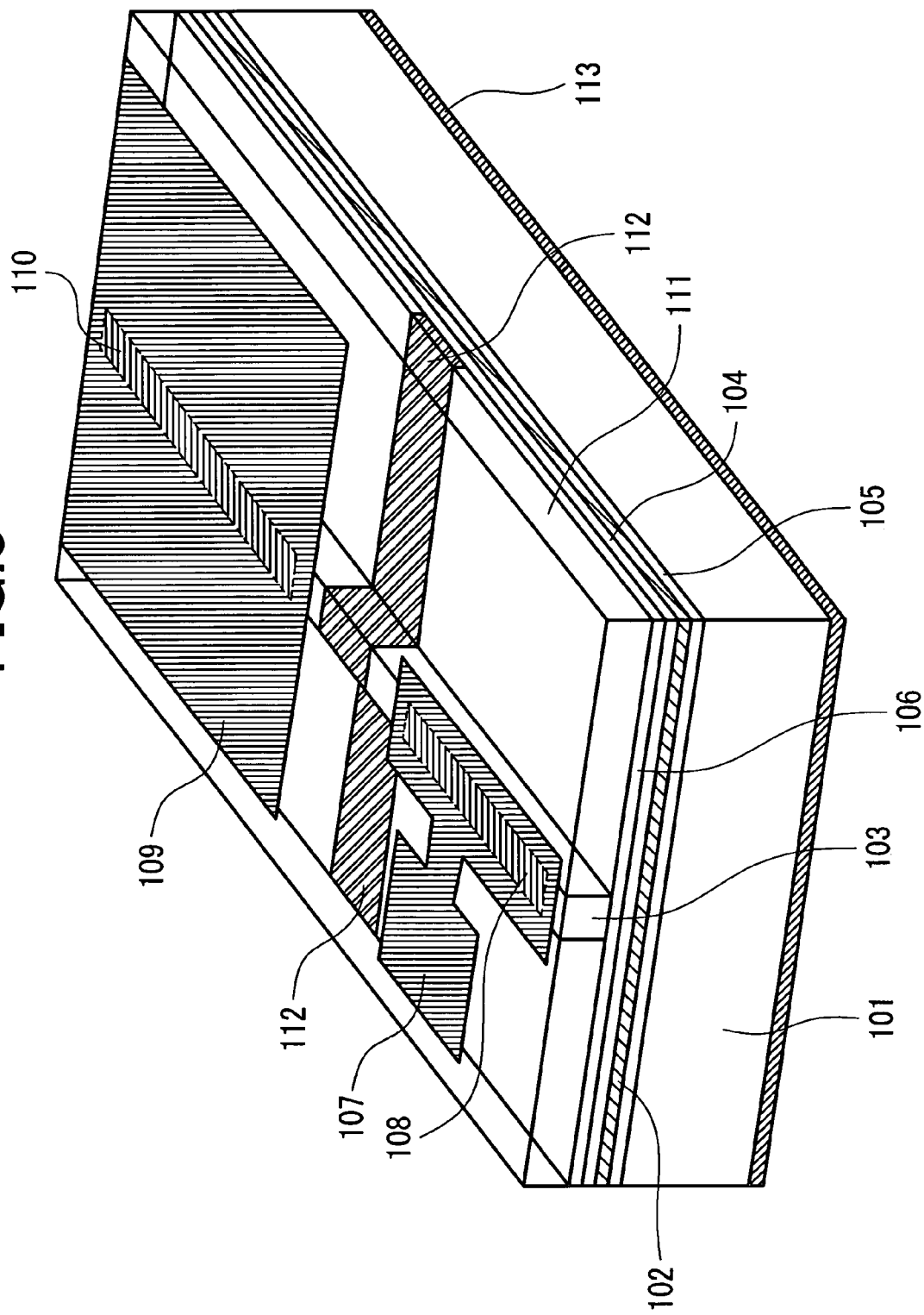
FIG. 3 is an oblique perspective view of a ridge waveguide EA/DFB chip as a conventional example.
Figure 4:
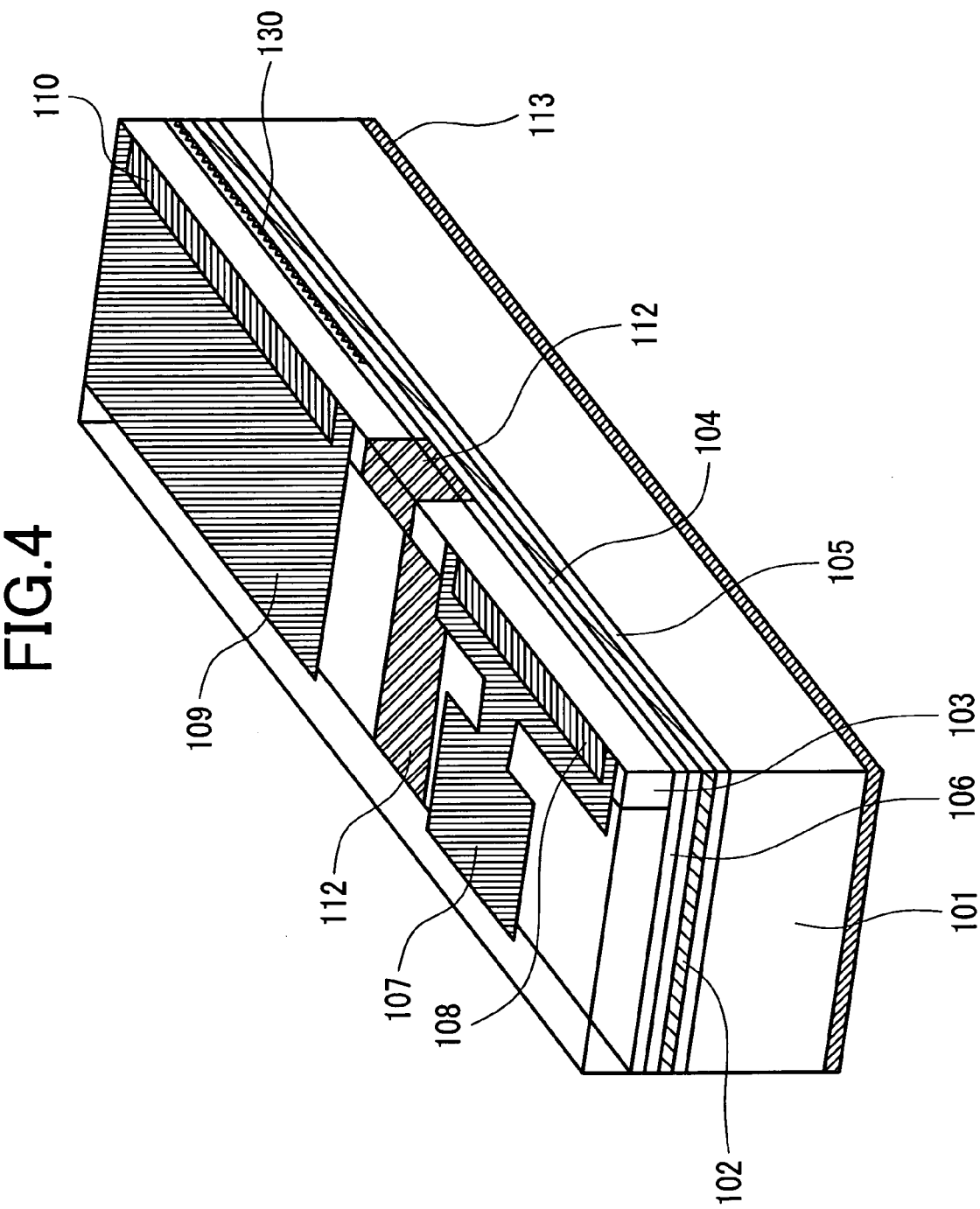
FIG. 4 is a view showing the sectional configuration of the ridge waveguide EA/DFB chip of FIG. 3 taken along the direction of the waveguide thereof.
Figure 5:
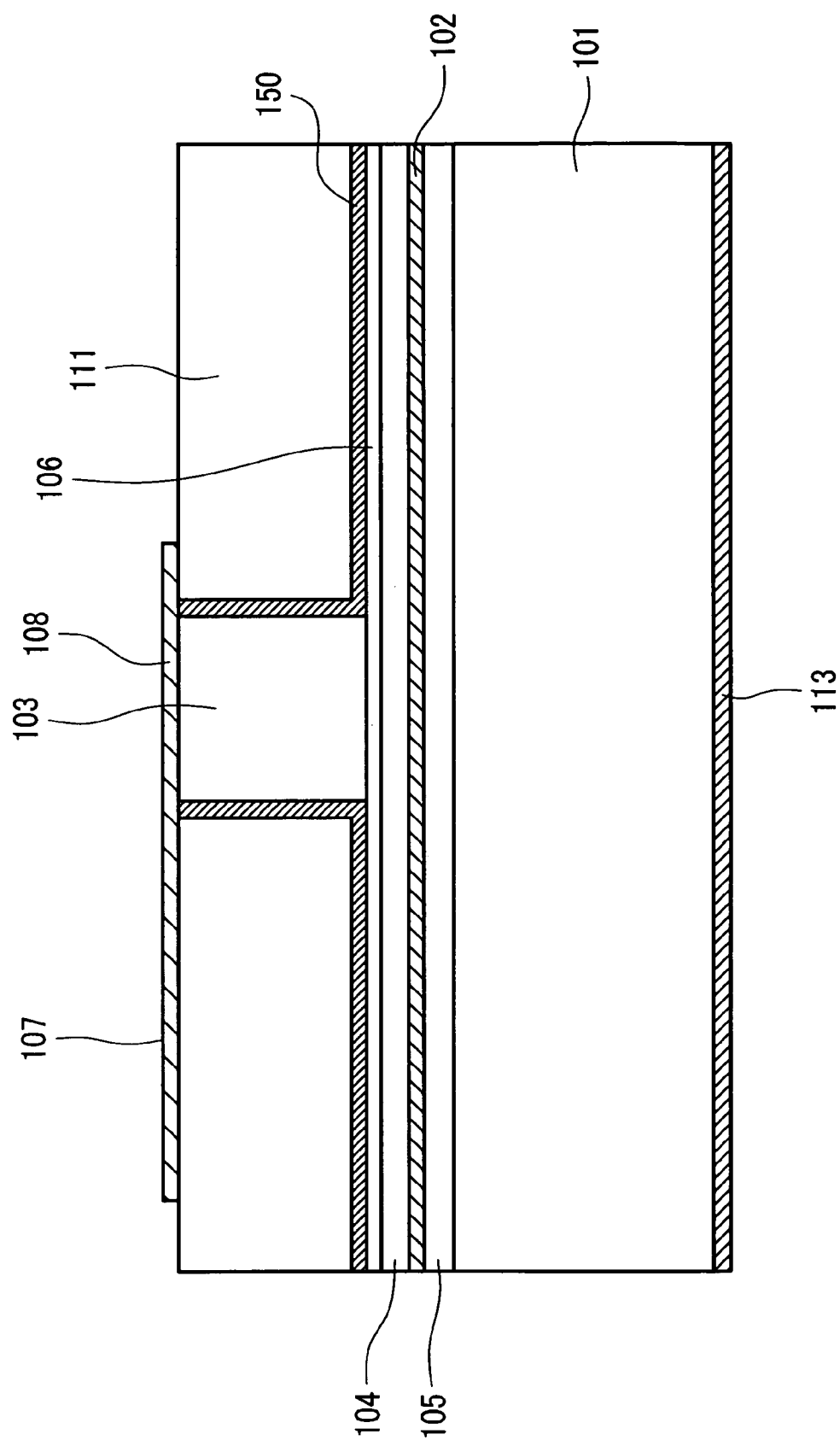
FIG. 5 is a cross-sectional view of the ridge waveguide EA/DFB chip as a conventional example, taken along the direction perpendicular to the waveguide of the EA modulating section.
Figure 6:
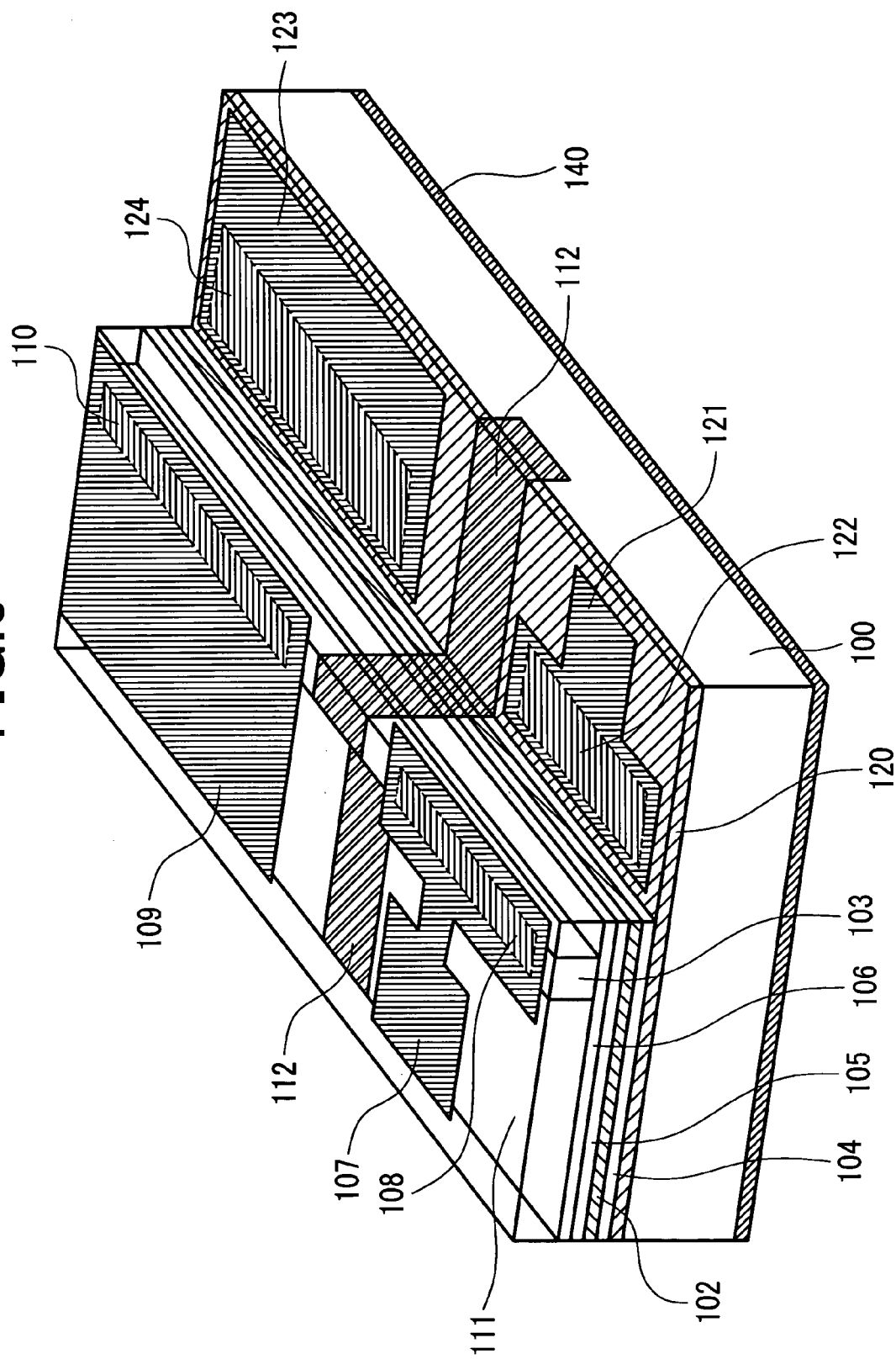
FIG. 6 is an oblique perspective view of a ridge waveguide EA/DFB chip according to an embodiment of the present invention where a semi-insulative substrate is used.
Figure 7:
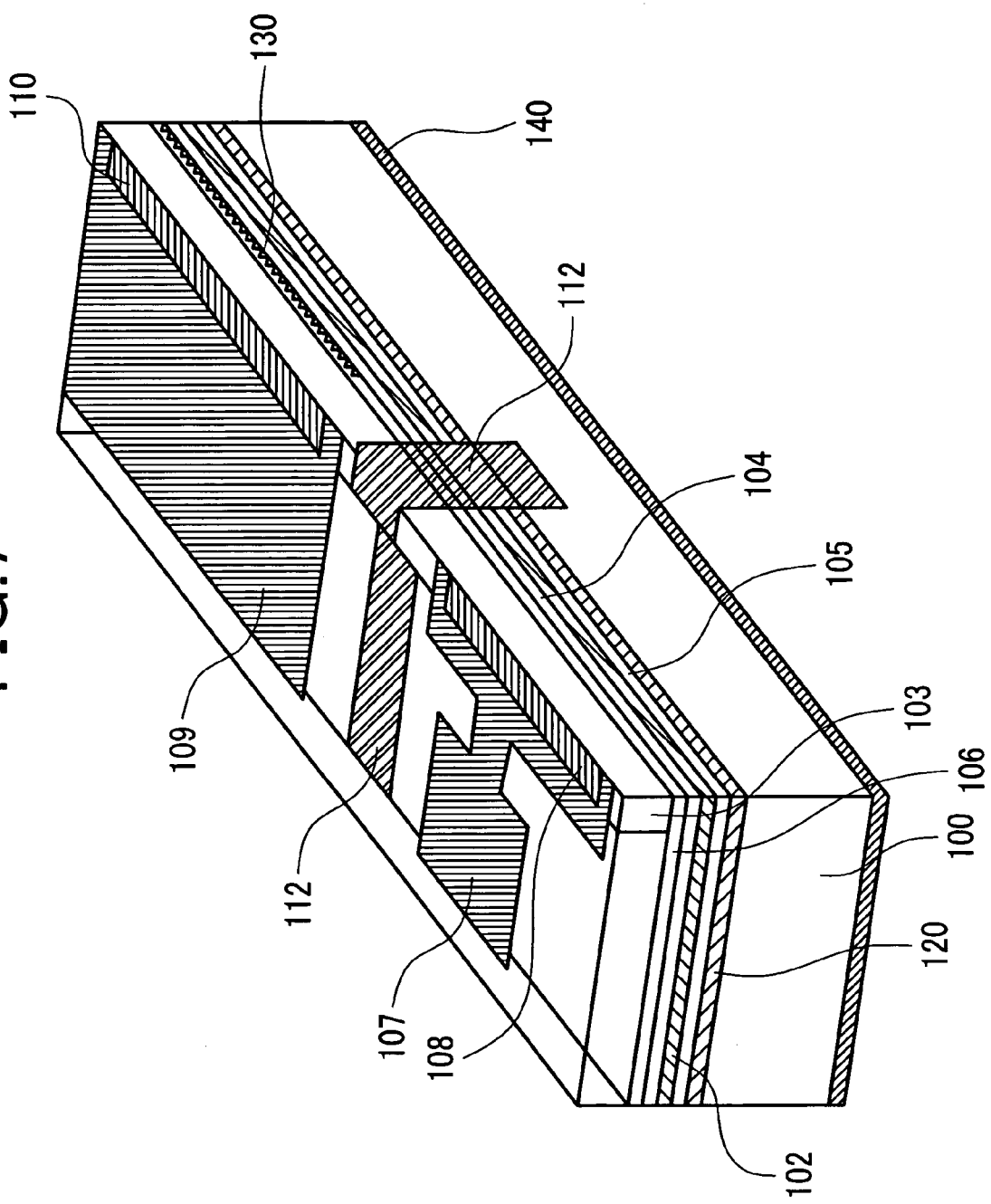
FIG. 7 is a view showing the sectional configuration of the ridge waveguide EA/DFB chip of FIG. 6 taken along the direction of the waveguide thereof.
Figure 8:
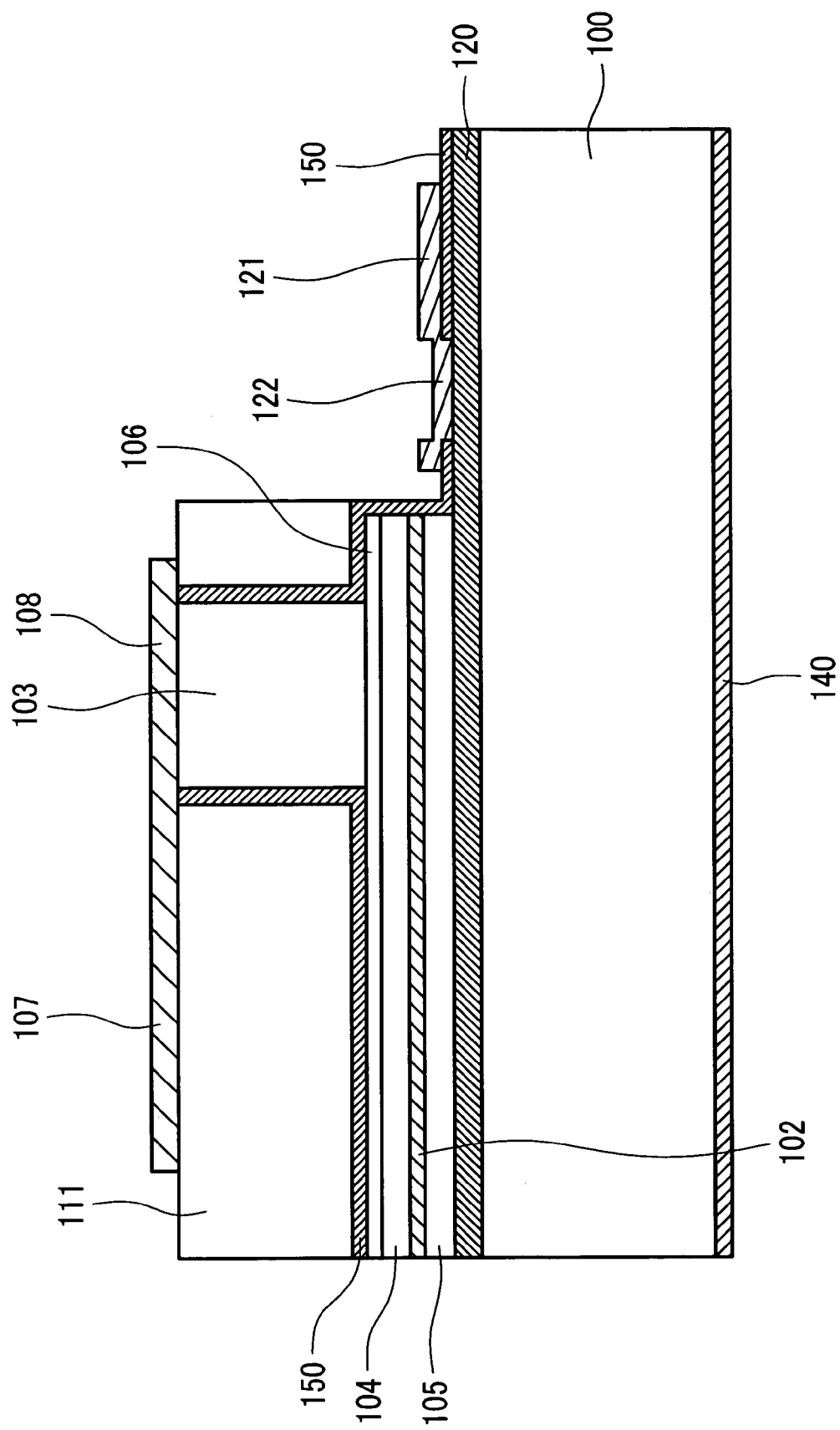
FIG. 8 is a cross-sectional view of the ridge waveguide EA/DFB chip of FIG. 6, taken along the direction perpendicular to the direction of the waveguide of the EA modulating section.

FIG. 6 is an oblique perspective view illustrating the structure of a ridge waveguide semiconductor laser device according to a first embodiment of the present invention. FIG. 7 shows a longitudinal section of the active layer of FIG. 6. FIG. 8 shows a traverse section of the EA modulating section.

Firstly, instead of a conductive substrate used as a common ground in the conventional structure, a semi-insulative or insulative substrate is used. Thereon, a lower contact layer of n-type conduction is formed. This layer functions if its thickness is in the range of 0.1 to 10 μm. Like the conventional structure, a lower optical guide layer, an active layer, an upper optical guide layer and a p-type cladding layer are stacked thereon in this order. In the region for isolating each device, an optical waveguide is formed. This isolation region is made of a semi-insulative or insulative material extending from at least the active layer to the substrate.

This isolation region is formed as below. Since the isolation region is an optical waveguide, it comprises a core sandwiched between the upper and lower cladding layers similar to the device sections. As a matter of convenience of epitaxial growth, the semiconductor used there is usually identical to that used to form the device sections. If a conductive semiconductor is used, the resistivity of this isolation region is raised by implanting protons or helium ions from the surface so as to reach the semi-insulative substrate. By this method, the anode and cathode of each device can be electrically isolated from the other device. It is also possible to obtain substantially the same structure by epitaxially growing a semi-insulative or insulative waveguide on the semi-insulative or insulative waveguide. Needless to say, the p-type and the n-type may be swapped.

It is also possible to use an ordinary conductive substrate instead of a semi-insulative or insulative substrate. In this case, the aforementioned device layers are formed after a semi-insulative or insulative layer is formed on the conductive substrate. Forming this semi-insulative or insulative layer eliminates electrical contact between the substrate and the devices, providing the same effect as the effect obtained by using a semi-insulative or insulative substrate.

Note that conductors such as metals have a resistivity of $10^{-6}$ Ωm or lower, semiconductors have a resistivity of $10^{-6}$ to $10^4$ Ωm and insulators have a resistivity of $10^8$ Ωm or higher. In this application, semi-insulative substrates and layers refer to materials having resistivity of $10^4$ to $10^8$, intermediary between that of semiconductors and that of insulators.

The following describes how the aforementioned structure is fabricated. At first, a conductive lower contact layer is deposited to a thickness of several μm on a semi-insulative substrate such as a FE-doped InP substrate. Then, then the lower optical guide layer, active layer, upper optical guide layer, cladding layers, contact layer and others to constitute the respective devices are epitaxially grown. The respective devices may be formed either concurrently by selective growth and other means or separately by using butt joint growth technology. After the contact layer is epitaxially grown, the upper cladding layer and the subsequent higher layers are shaped into a stripe by etching. Then, such ions as protons or helium ions are implanted so that they can reach the substrate. This raises the isolation resistance of both p and n sides between the devices.

It is also possible to realize a high resistance isolation region by etching the isolation region after the devices are epitaxially grown. In this case, the isolation region is etched down to the substrate and a semi-insulative layer such as Fe- or Ru-doped InP is formed there by the butt joint method.

Then, a region distant from the mesa is etched until the lower contact layer is revealed. A passivation film made of $SiO_2$ or $SiN_x$ is formed over the whole top surface of the chip. Then, holes are made through the passivation film where it is necessary to allow an electrode to be in contact with a contact layer. Finally, electrodes are respectively formed for the devices. As well, these electrodes may also be obtained by forming a single electrode and separating it by patterning.

The isolation resistance of the upper layers can be also be raised by removing the electrode contact layer and other low resistance layers from the isolation region through etching and making the isolation region enough long.

It is also possible to obtain substantially the same structure on a conductive substrate instead of a semi-insulative substrate. In this case, a semi-insulative layer of several μm in thickness is epitaxially grown before the devices are formed thereon.

As for other devices, it seems easy to conjecture from the above mentioned method how they should be integrated.

SECOND EMBODIMENT

Figure 9:
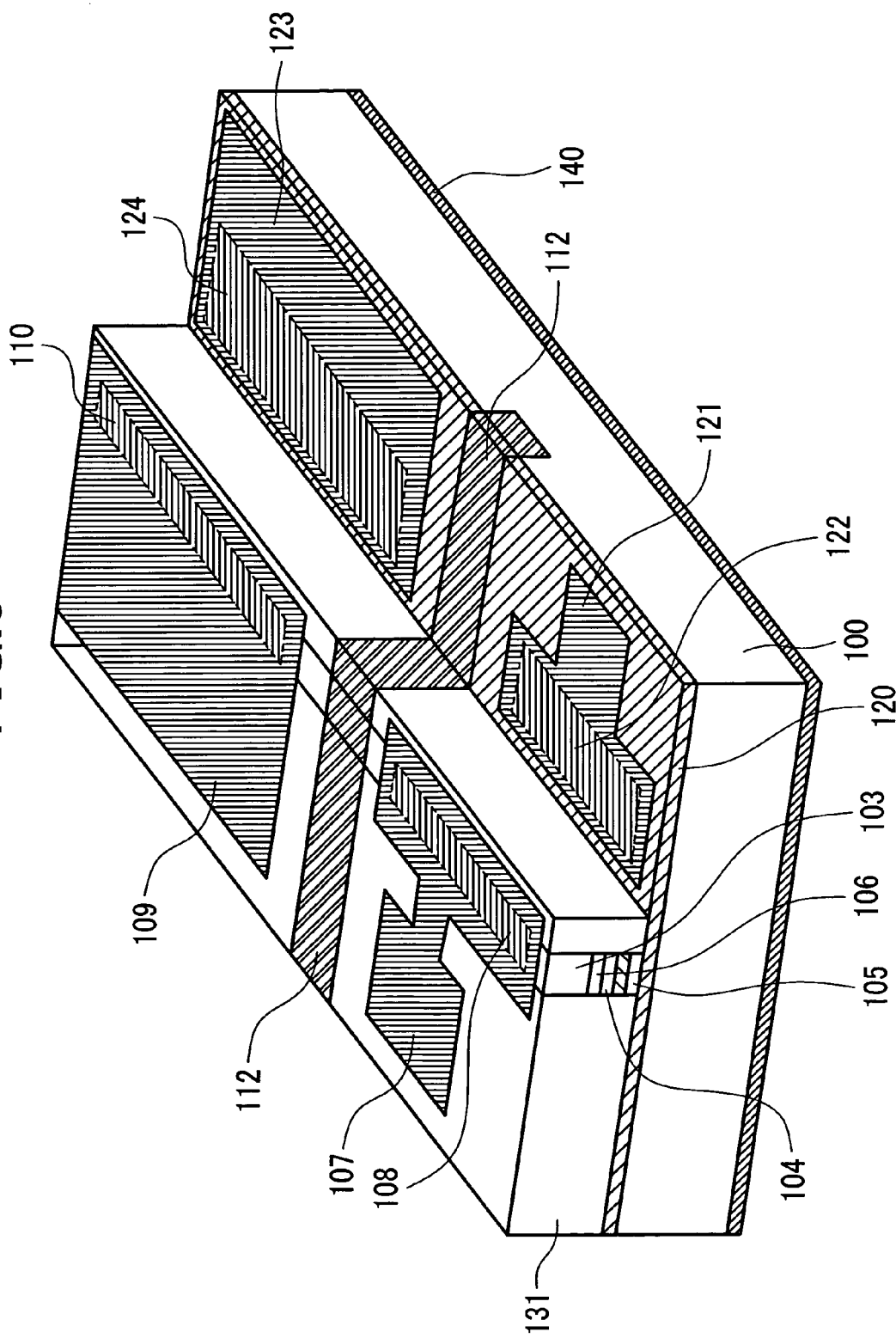
FIG. 9 is an oblique perspective view of a buried-waveguide EA/DFB chip according to another embodiment of the present invention.
Figure 10:
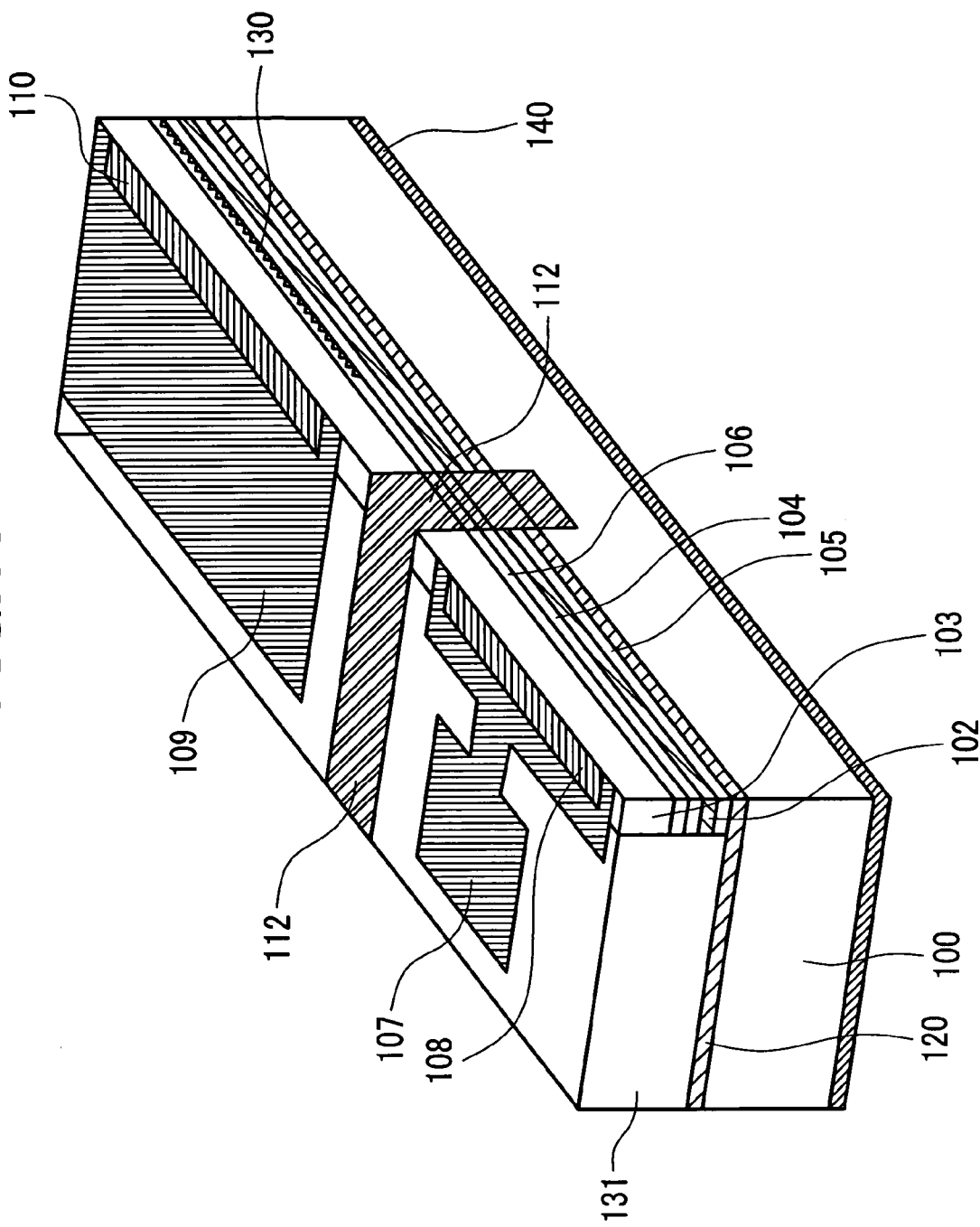
FIG. 10 is a view showing the sectional configuration of the buried-waveguide EA/DFB chip of FIG. 9.

FIG. 9 is an oblique perspective view illustrating the structure of an optical modulator-integrated laser according to a second embodiment of the present invention. Whereas the first embodiment is of the ridge waveguide type, this embodiment has a buried-heterostructure waveguide. FIG. 10 shows a longitudinal section of the stripe. A description of how this chip is fabricated is omitted since the fabrication method is the same as for the first embodiment except for the mesa etching process and the subsequent forming of a buried layer 131 due to the introduction of the buried-heterostructure waveguide.

THIRD EMBODIMENT

Figure 11:
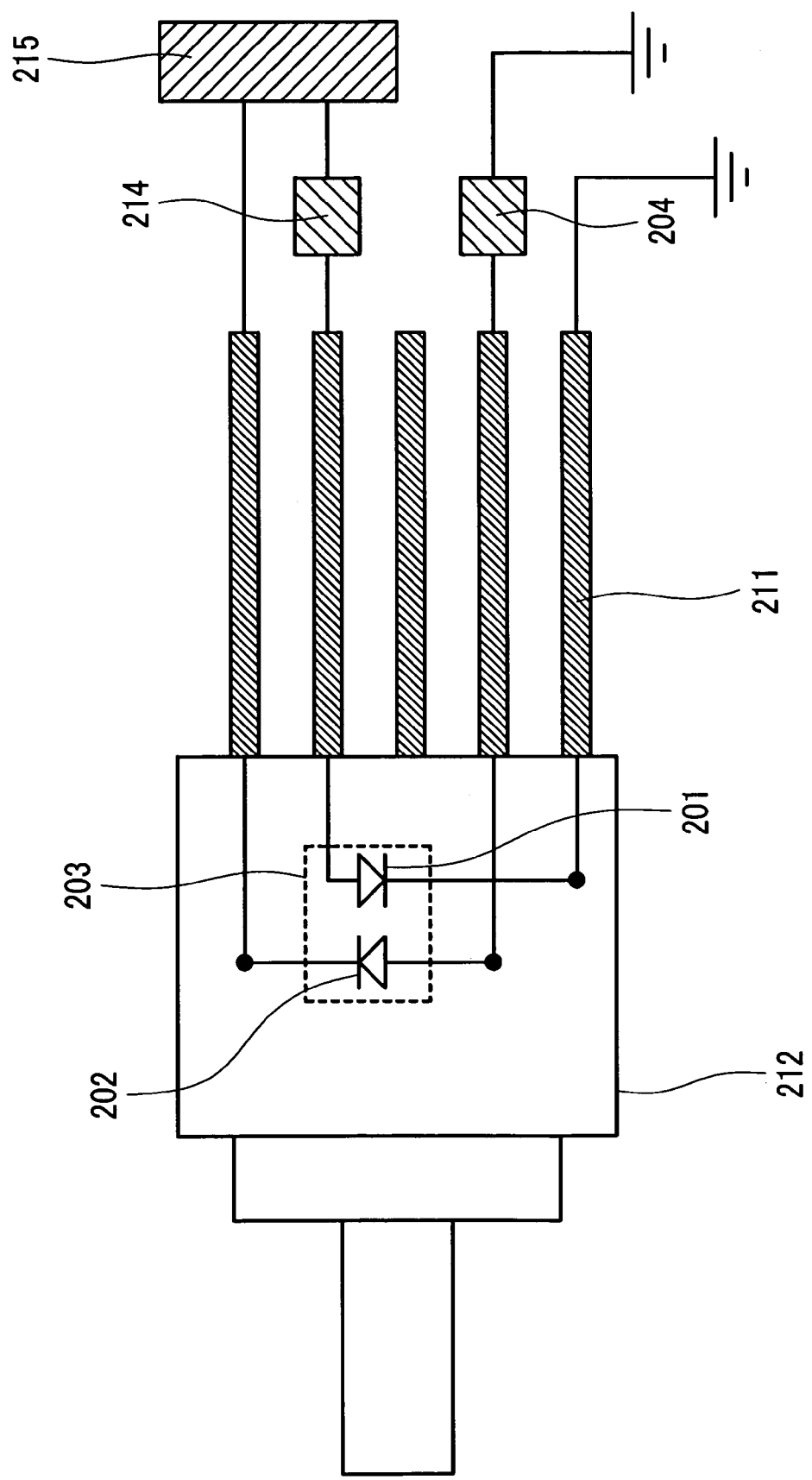
FIG. 11 schematically illustrates a compact optical transmission module where an optical modulator-integrated laser which is driven by a single power supply according to the present invention is mounted.

FIG. 11 is a schematic view of a third embodiment of the present invention. This embodiment is a compact optical transmission module in which an optical modulator-integrated laser is mounted. The optical modulator-integrated laser according to the present invention can be driven by a single power supply. The optical modulator-integrated laser 203 having a DFB laser 210 and an EA modulator 202 integrated monolithically according to the first or second embodiment is mounted in the compact optical transmission module 212. A driver IC 204 for the EA modulator and driver IC 214 for the DFB laser may be integrated on the same chip as well. As mentioned earlier, this module can be driven by a positive power supply 215 alone, spacing saving and power saving are possible in total.

FOURTH EMBODIMENT

FIG. 12 is a schematic view of a fourth embodiment of the present invention. This embodiment is a compact optical transceiver package in which a compact optical transmission module 222 according to the third embodiment and a separate compact reception module 223 are mounted. In the figure, reference numeral 224 denotes a drive system for the optical transmission module, 225 is a drive system for the optical reception module, 226 is a compact optical transceiver package and 221 is a pair of fibers respectively for transmission and reception.

The following describes reference numerals used in the drawings attached to this application.
100 . . . Semi-Insulative Substrate
101 . . . Conductive Semiconductor Substrate
102 . . . Active Layer
103 . . . Mesa Guide Layer
104 . . . Upper Optical Guide Layer
105 . . . Lower Optical Guide Layer
106 . . . Upper Cladding Layer
107 . . . EA Modulator Upper Electrode
108 . . . EA Modulator Upper Electrode Contact Area
109 . . . DFB Laser Upper Electrode
110 . . . DFB Laser Upper Electrode Contact Area
111 . . . Low Permittivity Resin
112 . . . Ion Implantation Region
113 . . . Lower Electrode Shared by Laser and Modulator
120 . . . Lower Contact Layer
121 . . . EA Modulator Lower Electrode
122 . . . EA Modulator Lower Electrode Contact Area
123 . . . DFB Laser Lower Electrode
124 . . . DFB Laser Lower Electrode Contact Area
130 . . . Grating
131 . . . Buried Layer
140 . . . Bottom Metal
150 . . . Passivation Film
201 . . . DFB Laser
202 . . . EA Modulator
203 . . . EA/DFB
204 . . . Driver IC for EA Modulator
205 . . . Positive DC Power Supply
206 . . . Negative DC Power Supply
211 . . . Lead
212 . . . Compact Optical Transmission Module
214 . . . Drive IC for DFB Laser
215 . . . Positive Power Supply
221 . . . Optical Fiber
222 . . . Optical Transmission Module
223 . . . Optical Reception Module
224 . . . Drive System for Optical Transmission Module
225 . . . Drive System for Optical Reception Module
226 . . . Compact Optical Transceiver Package

The invention claimed is:

1. An optical integrated circuit which is driven by a single power supply, said optical integrated circuit including at least two devices which are biased in the mutually opposite directions, each of said devices comprising:
an electrically semi-insulative or insulative substrate or an electrically semi-insulative or insulative first layer;
a second layer including an active layer formed on the substrate or the first layer;
an optical waveguide which is formed on the second layer so as to optically couple with the other device; and
a selectively formed high-resistivity isolation region which partly includes the optical waveguide and the active layer and extends to at least the substrate or the first layer so that each of an anode and cathode of the device is electrically isolated from the other device, wherein the high-resistivity isolation region is formed by an epitaxially-grown semi-insulative semiconductor layer.

2. An optical integrated circuit which is driven by a single power supply according to claim 1, wherein at least two of a semiconductor, an optical modulator, an optical amplifier and an optical detector are integrated.

3. An optical integrated circuit which is driven by a single power supply according to claim 1, wherein at least two of a semiconductor, an optical modulator, an optical amplifier and an optical detector are integrated.

4. An optical integrated circuit which is driven by a single power supply according to claim 1, wherein cladding layers which sandwich a core layer forming the optical waveguide are shared by each of said devices.

5. An optical integrated circuit which is driven by a single power supply according to claim 4, wherein at least two of a semiconductor, an optical modulator, an optical amplifier and an optical detector are integrated.

6. An optical transmission module using the optical integrated circuit which is driven by a single power supply, said optical integrated circuit including at least two devices which are biased in the mutually opposite directions, each of said devices comprising: an electrically semi-insulative or insulative substrate or an electrically semi-insulative or insulative first layer; a second layer including an active layer formed on the substrate or the first layer; an optical waveguide which is formed on the second layer so as to optically couple with the other device; and a selectively formed high-resistivity isolation region which partly includes the optical waveguide and the active layer and extends to at least the substrate or the first layer so that each of an anode and cathode of the device is electrically isolated from the other device, wherein the high-resistivity isolation region is formed by an epitaxially-grown semi-insulative semiconductor layer.

7. An optical transmission module using the optical integrated circuit which is driven by a single power supply, said optical integrated circuit including at least two devices which are biased in the mutually opposite directions, each of said devices comprising: an electrically semi-insulative or insulative substrate or an electrically semi-insulative or insulative first layer; a second layer including an active layer formed on the substrate or the first layer; an optical waveguide which is formed on the second layer so as to optically couple with the other device; and a selectively formed high-resistivity isolation region which partly includes the optical waveguide and the active layer and extends to at least the substrate or the first layer so that each of an anode and cathode of the device is electrically isolated from the other device, wherein at least two of a semiconductor, an optical modulator, an optical amplifier and an optical detector are integrated, and the high-resistivity isolation region is formed by an epitaxially-grown semi-insulative semiconductor layer.

8. An optical transmission module using the optical integrated circuit which is driven by a single power supply, said optical integrated circuit including at least two devices which are biased in the mutually opposite directions, each of said devices comprising: an electrically semi-insulative or insulative substrate or an electrically semi-insulative or insulative first layer; a second layer including an active layer formed on the substrate or the first layer; an optical waveguide which is formed on the second layer so as to optically couple with the other device; and a selectively formed high-resistivity isolation region which partly includes the optical waveguide and the active layer and extends to at least the substrate or the first layer so that each of an anode and cathode of the device is electrically isolated from the other device wherein the isolation region is formed by an epitaxially-grown semi-insulative semiconductor layer and wherein at least two of a semiconductor, an optical modulator, an optical amplifier and an optical detector are integrated.

9. An optical transmission module using the optical integrated circuit which is driven by a single power supply, said optical integrated circuit including at least two devices which are biased in the mutually opposite directions, each of said devices comprising: an electrically semi-insulative or insulative substrate or an electrically semi-insulative or insulative first layer; a second layer including an active layer formed on the substrate or the first layer; an optical waveguide which is formed on the second layer so as to optically couple with the other device; and a selectively formed high-resistivity isolation region which partly includes the optical waveguide and the active layer and extends to at least the substrate or the first layer so that each of an anode and cathode of the device is electrically isolated from the other device wherein cladding layers which sandwich a core layer forming the optical waveguide are shared by each of said devices and wherein at least two of a semiconductor, an optical modulator, an optical amplifier and an optical detector are integrated, and the high-resistivity isolation region is formed by an epitaxially-grown semi-insulative semiconductor layer.

10. An optical communication system unit using the optical transmission module using the optical integrated circuit which is driven by a single power supply, said optical integrated circuit including at least two devices which are biased in the mutually opposite directions, each of said devices comprising: an electrically semi-insulative or insulative substrate or an electrically semi-insulative or insulative first layer; a second layer including an active layer formed on the substrate or the first layer; an optical waveguide which is formed on the second layer so as to optically couple with the other device; and a selectively formed high-resistivity isolation region which partly includes the optical waveguide and the active layer and extends to at least the substrate or the first layer so that each of an anode and cathode of the device is electrically isolated from the other device, wherein the high-resistivity isolation region is formed by an epitaxially-grown semi-insulative semiconductor layer.

11. An optical communication system unit using the optical transmission module using the optical integrated circuit which is driven by a single power supply, said optical integrated circuit including at least two devices which are biased in the mutually opposite directions, each of said devices comprising: an electrically semi-insulative or insulative substrate or an electrically semi-insulative or insulative first layer; a second layer including an active layer formed on the substrate or the first layer; an optical waveguide which is formed on the second layer so as to optically couple with the other device; and a selectively formed high-resistivity isolation region which partly includes the optical waveguide and the active layer and extends to at least the substrate or the first layer so that each of an anode and cathode of the device is electrically isolated from the other device, wherein at least two of a semiconductor, an optical modulator, an optical amplifier and an optical detector are integrated, and the high-resistivity isolation region is formed by an epitaxially-grown semi-insulative semiconductor layer.

12. An optical communication system unit using the optical transmission module using the optical integrated circuit which is driven by a single power supply, said optical integrated circuit including at least two devices which are biased in the mutually opposite directions, each of said devices comprising: an electrically semi-insulative or insulative substrate or an electrically semi-insulative or insulative first layer; a second layer including an active layer formed on the substrate or the first layer; an optical waveguide which is formed on the second layer so as to optically couple with the other device; and a selectively formed high-resistivity isolation region which partly includes the optical waveguide and the active layer and extends to at least the substrate or the first layer so that each of an anode and cathode of the device is electrically isolated from the other device wherein the isolation region is formed by an epitaxially-grown semi-insulative semiconductor layer and wherein at least two of a semiconductor, an optical modulator, an optical amplifier and an optical detector are integrated.

13. An optical communication system unit using the optical transmission module using the optical integrated circuit which is driven by a single power supply, said optical integrated circuit including at least two devices which are biased in the mutually opposite directions, each of said devices comprising: an electrically semi-insulative or insulative substrate or an electrically semi-insulative or insulative first layer; a second layer including an active layer formed on the substrate or the first layer; an optical waveguide which is formed on the second layer so as to optically couple with the other device; and a selectively formed high-resistivity isolation region which partly includes the optical waveguide and the active layer and extends to at least the substrate or the first layer so that each of an anode and cathode of the device is electrically isolated from the other device wherein cladding layers which sandwich a core layer forming the optical waveguide are shared by each of said devices and wherein at least two of a semiconductor, an optical modulator, an optical amplifier and an optical detector are integrated, wherein the high-resistivity isolation region is formed by an epitaxially-grown semi-insulative semiconductor layer.

14. A method for manufacturing an optical integrated circuit which is driven by a single power supply, the manufacturing method including the steps of:

preparing an electrically semi-insulative or insulative substrate;

forming a stacked layer on the substrate where an optical guide layer, first contact layer, an active layer, a second guide layer, a cladding layer, and a second contact layer are deposited in this order;

selectively etching the stacked layer so as to extend to the substrate;

epitaxially growing a semi-insulative semiconductor layer on the selectively etched region; and forming a electrode for the device after selectively etching a passivation film being deposited on the stacked layer.

15. A method for manufacturing an optical integrated circuit which is driven by a single power supply, the manufacturing method including the steps of:

preparing an electrically semi-insulative or insulative first layer being formed on a conductive substrate;

forming a stacked layer on the first layer where an optical guide layer, first contact layer, an active layer, a second guide layer, a cladding layer, and a second contact layer are deposited in this order;

selectively etching the stacked layer being extended to the first layer; and epitaxially growing a semi-insulative semiconductor layer on the selectively etched region.

* * * * *